(12) United States Patent
Naumann et al.

(10) Patent No.: US 10,732,227 B2
(45) Date of Patent: Aug. 4, 2020

(54) METHOD FOR DETERMINING A CURRENT STATE OF CHARGE VALUE OF A BATTERY, BATTERY ARRANGEMENT, AND MOTOR VEHICLE

(71) Applicant: AUDI AG, Ingolstadt (DE)

(72) Inventors: Rolf Naumann, Etting (DE); Matthias Kraus, Karlskron (DE)

(73) Assignee: AUDI AG, Ingolstadt (DE)

( * ) Notice: Subject to any disclaimer, the term of this patent is extended or adjusted under 35 U.S.C. 154(b) by 196 days.

(21) Appl. No.: 16/037,195

(22) Filed: Jul. 17, 2018

(65) Prior Publication Data

US 2019/0162793 A1 May 30, 2019

(30) Foreign Application Priority Data

Nov. 28, 2017 (DE) .......................... 10 2017 221 248

(51) Int. Cl.
*G01R 31/387* (2019.01)
*G01R 31/389* (2019.01)
*G01R 31/374* (2019.01)
*G01R 31/36* (2020.01)

(52) U.S. Cl.
CPC ....... *G01R 31/387* (2019.01); *G01R 31/3648* (2013.01); *G01R 31/374* (2019.01); *G01R 31/389* (2019.01)

(58) Field of Classification Search
CPC combination set(s) only.
See application file for complete search history.

(56) References Cited

U.S. PATENT DOCUMENTS

| | | | | |
|---|---|---|---|---|
| 2006/0238203 A1* | 10/2006 | Kelley | ................ | G01R 31/389 324/433 |
| 2007/0236181 A1* | 10/2007 | Palladino | ............ | H01M 10/486 320/130 |
| 2011/0234167 A1* | 9/2011 | Kao | .................... | G01R 31/3828 320/132 |

FOREIGN PATENT DOCUMENTS

| | | |
|---|---|---|
| DE | 199 03 239 A1 | 8/2000 |
| DE | 100 02 473 A1 | 7/2001 |
| DE | 10 2005 052 448 A1 | 7/2006 |
| DE | 10 2009 058 893 A1 | 7/2010 |

(Continued)

OTHER PUBLICATIONS

Mahmud et al., The Impact of Battery Operating Temperature and State of Charge on the Lithium-Ion Battery Internal Resistance, Jurnal Mekanikal, vol. 40, Jun. 1-8, 2017 (Year: 2017).*

(Continued)

*Primary Examiner* — Daniel R Miller
(74) *Attorney, Agent, or Firm* — Maier & Maier, PLLC

(57) ABSTRACT

The invention relates to a method for determining a current state of charge value (SOC0, SOC1, SOC2) of a battery of a specific battery type, wherein a field of characteristic curves is provided, which, for certain different predetermined temperature ranges ($\Delta T$), specifies an internal resistance (Ri) for the specific battery type in dependence on the state of charge (SOC) for the specific battery type, a current temperature (T) of the battery is measured, a current internal resistance value (Ri0, Ri1) of the battery is determined, and, on the basis of the current temperature (T) and the current internal resistance value (Ri0, Ri1), the current state of charge value (SOC0, SOC1, SOC2) of the battery is determined by means of the field of characteristic curves.

9 Claims, 1 Drawing Sheet

(56) References Cited

FOREIGN PATENT DOCUMENTS

| | | |
|---|---|---|
| DE | 10 2013 206 189 A1 | 10/2014 |
| DE | 11 2013 006 736 T5 | 11/2015 |
| DE | 10 2017 103 377 A1 | 8/2017 |
| EP | 1 877 812 B1 | 6/2010 |
| FR | 2 749 397 A1 | 12/1997 |

OTHER PUBLICATIONS

Wang et al., Online Lithium-Ion Battery Internal Resistance Measurement Application in State-of-Charge Estimation Using the Extended Kalman Filter, Energies 2017, 10, 1284 (Year: 2017).*

Examination Report dated May 23, 2018 of corresponding German application No. 10 2017 221 248.9; 9 pgs.

Extended European Search Report dated Jan. 31, 2019, in connection with corresponding EP Application No. 18177924.0 (10 pgs., including machine-generated English translation).

* cited by examiner

METHOD FOR DETERMINING A CURRENT STATE OF CHARGE VALUE OF A BATTERY, BATTERY ARRANGEMENT, AND MOTOR VEHICLE

FIELD

The invention relates to a method for determining a current state of charge value of a battery of a specific battery type as well as to a battery arrangement with a battery of a specific battery type, and to a control device for determining a current state of charge value of the battery. The invention also includes a motor vehicle having such a battery arrangement.

BACKGROUND

In order to be able to ensure a flawless and safe operation in the electric power system of a motor vehicle, the determination of the state of charge, which is usually also referred to as the SOC (state of charge), of on-board electric power system batteries or traction batteries, in particular as a component of the detection of the battery status, plays an important role. In the automobile sector, there are already a number of known methods for accomplishing this determination. For a given initial condition of the state of charge and a known capacity of the battery, it is possible by means of integration of the current, for example, to determine the change of the state of charge under load during, for example, charging or discharging. In addition, there is the method of so-called 100 percent recalibration for a fully charged battery. Another common method is the measurement of the battery open-circuit voltage, which enables very accurate information about the current state of charge of a battery.

A drawback of these known methods is that they are either very inaccurate or can be carried out only under very special prerequisites. For example, the methods for determining the state of charge by integrating current lead to an error that increases over time and, in the medium term, results in a marked deviation from the actual state of charge of the battery. The known recalibration methods could thereby offer a remedy for this, but they are restricted to special environmental and system conditions, such as, for example, a fully charged battery or open-circuit voltage condition. However, in order for a recalibration by measuring the open-circuit voltage of the battery to be possible at all, the characteristic between the state of charge and the battery open-circuit voltage for the respectively employed cell chemistry has to permit a clear assignment between the state of charge and the battery open-circuit voltage. In the case of some cell chemistries, such as, for example, in the case of a lithium iron phosphate ($LiFePO_4$) rechargeable battery, this is not the case owing to the flat characteristic curve.

In this connection, DE 10 2013 206 189 A1, for example, describes a method for determining a state of charge of a rechargeable battery, in which the state of charge is determined on the basis of a voltage differential, that is, on the basis of the derivative of the voltage curve of the rechargeable battery, by way of a suitable variable.

Moreover, DE 11 2013 006 736 T5 describes a method and a device for estimating a remaining battery capacity, in accordance with which the battery capacity is determined when switching between a charging and a discharging of the battery. In this case, the determination of the capacity is based on the detection of the discharge voltage of the battery. Here, too, the determination of the capacity can occur only in a specific situation, namely, when switching between charging and discharging of the battery.

SUMMARY

The object of the present invention is therefore to provide a method for determining a current state of charge value of a battery, a battery arrangement, and a motor vehicle that allow a determination of the state of charge value that is as simple and accurate as possible.

This object is achieved by a method for determining a current state of charge value of a battery, by a battery arrangement, and by a motor vehicle with the features in accordance with the respective independent claims. Advantageous embodiments of the invention are the subject of the dependent patent claims, the description, and the figures.

In a method according to the invention for determining a current state of charge value of a battery of a specific battery type, a field of characteristic curves is provided, which, for respective different predetermined temperature ranges, indicates an internal resistance for the specific battery type as a function of the state of charge for the specific battery type. Furthermore, a current temperature of the battery is measured and a current internal resistance value of the battery is determined. On the basis of the current temperature and the current internal resistance value, the current state of charge value of the battery is determined by means of the field of characteristic curves.

Both the current battery temperature and the current internal resistance value of the battery can be determined in a simple way. In particular, both the battery temperature and the internal resistance can be determined by way of methods that are independent of the state of charge, that is, methods that make possible a determination of the temperature and of the internal resistance even without any knowledge of the current state of charge of the battery. Accordingly, it is then possible correspondingly to determine the current state of charge on the basis of the determined current internal resistance value and the current temperature by means of the field of characteristic curves. Moreover, such a determination can take place in virtually any desired operating situation of the battery and of the motor vehicle, when, for example, the battery finds use in a motor vehicle. This results in markedly fewer restrictions situationally in regard to the determination of the state of charge value of a battery. In particular, even a continuous and ongoing monitoring and determination of the state of charge value of the battery is made possible thereby. In addition, in this case, there are no restrictions whatsoever in regard to the kind of battery or the type of battery, which, in this connection, refers to the cell chemistry used in the battery. A corresponding field of characteristic curves, that is, a field of characteristic curves for a specific battery type, can be provided in a simple way—for example, experimentally—for each desired type of battery and, accordingly, can be used for the method according to the invention in a simple way for each specific battery type. For the determination of such a field of characteristic curves, it is possible, for example, to provide a test battery of a specific cell type and then, for different temperatures in the predetermined different temperature ranges, to determine the respective associated internal resistance value of the test battery for different states of charge—for example, when the test battery is successively discharged or charged. In this case, it is also possible for a virtually continuous measurement of the internal resistance to take place for a continuously decreasing or increasing state of charge of the test battery, so that, ultimately, for a respective predetermined temperature range, a corresponding uninterrupted characteristic curve can be provided, which describes the relation between internal resistance and state of charge for the specific battery type. The results thus obtained or the characteristic curves can then be incorporated into a field of characteristic curves for the specific battery type. This can be carried out for a large number of test batteries of different battery types, that is, with different cell chemistries. Accordingly, for a particular type of battery, it is possible to provide the matching field of characteristic curves. In addition, it is possible experimentally to determine especially accurately the relation between battery temperature, internal resistance of the battery, and the state of charge of the battery, so that, on the basis of such a field of characteristic curves, an especially accurate determination of the current state of charge value of the battery is also made possible. In this way, it is possible both to use the method according to the invention in an especially advantageous way and without any restriction for any desired cell chemistry, that is, for each battery type and, at the same time, to determine the state of charge in an especially accurate way in nearly any desired situation. Therefore, for example, the method according to the invention can also find use for cell chemistries such as those, for example, in lithium iron phosphate rechargeable batteries. Hence, it is then advantageously possible for a determination of the state of charge or a recalibration of the state of charge to be made in an especially simple and efficient way, given a knowledge of the internal resistance and the temperature.

In connection with the invention, a battery can be understood to mean, in general, any desired energy storage unit and, in particular, an electrochemical energy storage unit. Preferably, the battery is designed as an energy storage unit based on lithium ion technology. Preferably, the invention finds use in motor vehicles. In this connection, the battery can represent a motor vehicle battery, such as, for example, an onboard electric power system battery or traction battery. However, the invention can also find use in very different fields of application, such as, for example, in electronic devices that use a battery or a rechargeable battery as a power supply or, in general, an electrochemical energy storage unit, in particular a rechargeable energy storage unit, as a power source. Electronic devices of this kind can be, for example, tablets, smartphones, laptops, smartwatches, or the like.

A state of charge value is understood here, in general, to mean the value, as a numerical quantity, of the state of charge of the battery. Correspondingly, the internal resistance value is understood to mean the value, as a numerical quantity, of the internal resistance of the battery.

The ultimately determined current state of charge value of the battery can be provided as a corresponding signal, depending on which a function is triggered. Such a function can be a control function for controlling at least one component, such as, for example, the battery arrangement or the motor vehicle, or another computation step, a recalibration of the state of charge, or the display of the current state of charge or corresponding information, such as, for example, a predicted range of travel or a need for charging or the equivalent, on a display or also a saving of the currently determined state of charge values in a memory unit.

Furthermore, it is possible to define as many different predetermined temperature ranges as desired. For example, a particular temperature range of 1° C. can be extended in measurement at least over a maximally single-digit degree Celsius range. In this case, the totality of the respective different temperature ranges covers a total temperature range that can be established in an application-specific manner. For applications in the motor vehicle range, this total temperature range can extend, for example, from −30° C. to 75° C. For other fields of application—for example, in mobile communication devices—the total temperature range can be measured differently and preferably covers all possible operating temperatures of the battery.

In an advantageous embodiment of the invention, if the measured current temperature of the battery lies in one of the predetermined temperature ranges in which the dependence of the internal resistance on the state of charge rises or falls strictly monotonically, the state of charge value of the battery is determined by means of the field of characteristic curves in such a way that the state of charge value of the battery is set equal to a state of charge value of the field of characteristic curves that, for the predetermined temperature range in which the currently measured temperature of the battery lies, is assigned, in accordance with the dependence, to the currently measured internal resistance value. Therefore, in the case where, for a specific temperature range, a clear possible assignment of the internal resistance value to the state of charge for the specific battery type is given, this being the case when the characteristic curve describing the relation between internal resistance and state of charge rises strictly monotonically or falls strictly monotonically, the assigned state of charge value of the battery for a determined current temperature and the current internal resistance value can be read off from the field of characteristic curves in an especially simple way.

In practice, it has been shown that, depending on the cell chemistry, it is not always possible to make a clear assignment between the internal resistance and the state of charge. For example, there are cases in which the characteristic curve for a specific temperature range or also for a plurality of or all specific temperature ranges has or have a maximum or a minimum or even a plurality of such extremes. Correspondingly, it can also happen that, for a specific temperature range, more than only one state of charge value can be assigned to a given internal resistance value. Therefore, in another advantageous embodiment of the invention, if the measured current temperature lies in one of the predetermined temperature ranges in which the dependence of the internal resistance on the state of charge has an extreme for an internal resistance value of the field of characteristic curves, the state of charge value of the battery is determined by means of the field of characteristic curves in such a way that it is checked whether at least two state of charge values, which, in accordance with the dependence, are assigned to the measured internal resistance value for the predetermined temperature range in which the current temperature lies, exist in the field of characteristic curves, and, if yes, the at least two state of charge values are determined from the field of characteristic curves and the current state of charge value of the battery is set equal to one of the at least two state of charge values in accordance with a predetermined selection procedure. It is then possible advantageously to check whether there is more than only one possible assignment of the internal resistance value to the corresponding state of charge value. If, in particular, this should not be the case, then it is possible to proceed as described above, and, for the measured temperature and the determined internal resistance value, simply to read off the corresponding state of charge value from the field of characteristic curves. However, if more than only one state of charge value can be assigned to a measured or determined internal resistance value, then there are further advantageous possibilities in order to determine which of these at least two possible state of charge values then represents the current state of charge value of the battery.

In accordance with another advantageous embodiment of the invention, it is provided that, in accordance with the predetermined selection procedure, the state of charge value of the battery is set equal to one of the at least two state of charge values determined from the field of characteristic curves, depending on an internal resistance value determined in a preceding time step and/or depending on the kind of extreme, that is, depending on whether the extreme represents a minimum or a maximum, and/or depending on a current charging situation of the battery, that is, depending on whether the battery is currently being charged or discharged.

This approach is especially advantageous when the corresponding characteristic curve, which, for a specific temperature range, describes the relation between the internal resistance and the state of charge, has only a single extreme, that is, either a minimum or a maximum. In this case, the knowledge of whether said extreme is a maximum or a minimum is also of advantage. This information can be determined in a simple way through the corresponding characteristic curves of the field of characteristic curves. It is especially advantageous in such a situation when the specific internal resistance values of the battery that follow in succession over time are regarded and, for example, are compared, in order to determine the correct state of charge value of the two possible state of charge values from the field of characteristic curves. When, for example, the internal resistance then initially falls to a minimum with increasing state of charge of the battery in accordance with the corresponding characteristic curve for a specific temperature range and subsequently rises once again with further increasing state of charge of the battery, then, through the determination of the internal resistance in two successive time steps during the charging of the battery, it is possible in a simple way to determine whether, at the present moment, one is situated on the branch of the characteristic curve that is falling to a minimum or is situated on the rising branch on the other side of the minimum. If two possible state of charge values from the field of characteristic curves are taken into consideration for the current state of charge value, with these two state of charge values being situated on different sides of the minimum of the characteristic curve, then this ambiguity can be resolved by the selection procedure just described, in accordance with which internal resistance values determined successively over time are compared in terms of their magnitude. For this purpose, a knowledge of the current charging situation of the battery is also of particular advantage. Thus, when the internal resistance falls over time with increasing state of charge of the battery, as is the case during charging of the battery, then, in the converse situation, that is, during discharging of the battery, the internal resistance would increase over the course of time. Through these three mentioned pieces of information, that is, the additional consideration of an internal resistance value determined in a preceding time step, the information on the kind of extreme of the characteristic curve, and the information about a current state of charge of the battery, it is thus advantageously possible, even for cell chemistries, that is, for battery types that do not always permit a clear assignment between the internal resistance and the state of charge of the battery, to determine the correct current state of charge value in a simple way.

In this case, the current charging situation of the battery can be determined in a simple way by means of measurement of a current of the battery, for example. In a battery, usually diverse sensors, such as, for example, temperature sensors for the determination of the current battery temperature and also current sensors for the determination of the total current of the battery are present in any case and, accordingly, can be utilized advantageously also to determine the state of charge. The battery current here represents the total current flowing into or out of the battery. On the basis of the arithmetic sign of this current, that is, the direction of the current, it is possible in a simple way to determine whether, at the moment, current is being drawn from the battery, as is the case for a discharging situation, or whether, at the moment, current is being supplied to the battery, as is the case for a charging situation of the battery.

In another advantageous embodiment of the invention, in accordance with the predetermined selection procedure, a second state of charge value of the battery is determined by means of an integration of a battery current over time and is compared with the at least two state of charge values determined from the field of characteristic curves, wherein the value of that one of the at least two state of charge values from the field of characteristic curves that has a smaller difference relative to the second state of charge value is set equal to the current state of charge value of the battery. In other words, in order to resolve the above-described ambiguity relative to an unclear assignment between the internal resistance value and the state of charge for one predetermined temperature range or for a plurality of predetermined temperature ranges, methods known from the prior art for determining the state of charge can be employed. This is of great advantage, in particular, when a characteristic curve of the field of characteristic curves for a specific battery type has a plurality of maxima or minima or, in general, has more than only one extreme. Although, in practice, this is rather rare, it is nonetheless possible in accordance with this advantageous embodiment of the invention to determine via the integral of the current, for example, the state of charge as a second state of charge value and to employ it as a plausibility condition. For the provision of this second state of charge value, that is, for the determination of the current state of charge value of the battery by way of another method, however, not only an integration of the current comes into consideration, but also other methods described in the introduction for determining the state of charge of a battery, as are known from the prior art, can also be considered. Thus, it is advantageously possible, in all eventualities, to reliably determine the state of charge value of a battery for a specific battery type.

In another advantageous embodiment of the invention, the current internal resistance value is determined as a quotient from a voltage change of a battery voltage, which results from a change in a battery current, and the change in the battery current is determined. Here, too, the battery current again represents the total current flowing into or out of the battery. In particular, this represents a common method for determining the internal resistance of a battery. Accordingly, the internal resistance can therefore be determined from the current and voltage profile during a voltage load and the voltage response resulting from it, in particular as a quotient of said quantities. The internal resistance can accordingly be described by the formula $R_i = \Delta U / \Delta I$, where $R_i$ represents the internal resistance, $\Delta I$ represents the current load or the change in the battery current, where, here, current and current strength are used synonymously, and $\Delta U$ represents the voltage response resulting from the change in the battery current, that is, the change in the battery voltage. Here, too, it is again possible for methods known from the prior art to be employed for determining the internal resistance, which do not presume a knowledge of the state of charge of the battery.

In an especially advantageous embodiment of the invention, the current internal resistance value is determined in continuous repetition based on an ongoing recording of current fluctuations of a measured battery current of the battery and voltage changes of the battery voltage associated with said current fluctuations, in particular, once again, as a quotient of said quantities. This embodiment of the invention is based on the realization that small current fluctuations, which are due, as a rule, to undesired fluctuations or disruptions of the onboard electric power system, can be utilized advantageously for determining the internal resistance. Disruptions or fluctuations of this kind in the onboard electric power system lead to ripples on the battery current; that is, an alternating current is superimposed on the direct current of the battery. Through a corresponding ongoing measurement of the battery current as well as of the battery voltage, it is accordingly possible advantageously to determine in an ongoing manner the internal resistance of the battery from the corresponding current fluctuations and the voltage responses resulting from them. This has the great advantage that, for the internal resistance measurement, a special situation does not need to be initiated, such as, for example, the deliberate creation of a specific current load, which, in turn, would disrupt the normal operation of the battery and, for example, could be carried out, in turn, only when the motor vehicle is at a standstill or similar situation. Through this advantageous embodiment of the invention, however, it is possible permanently to determine and to monitor the internal resistance value of the battery, so that, ultimately, a permanent and continuous possibility for monitoring the state of charge of the battery ensues. Moreover, this ongoing monitoring or computation of the internal resistance also makes possible, in an especially advantageous way the above-described embodiment for resolving ambiguities in the assignment of an internal resistance value to a state of charge value if the corresponding characteristic curve has one extreme or a plurality of extremes. In such a situation, such ambiguities can be resolved simply by taking into consideration the time course of the internal resistance, this now being possible in a simple and reliable way through this advantageous embodiment of the invention, because this embodiment makes possible a continuous or virtually continuous determination of the internal resistance in each situation.

The invention further relates to a battery arrangement with a battery of a specific battery type and a control device for determining a current state of charge value of the battery. In this case, the control device has a memory unit, in which a field of characteristic curves is stored, which, for certain different predetermined temperature ranges, specifies an internal resistance for the specific battery type, depending on the state of charge for the specific battery type. The battery arrangement here has a sensor device, which is designed to record a current temperature of the battery and to determine a current internal resistance value of the battery, wherein the control device is designed to determine, on the basis of the current temperature and the current internal resistance value, the current state of charge value of the battery by means of the field of characteristic curves.

The sensor device can have a temperature sensor, for example, which is integrated in the battery, for recording the current temperature. In addition, for determining the current internal resistance value of the battery, the sensor arrangement can have at least one current sensor as well as a voltage sensor for recording the battery current and the battery voltage.

The invention further relates also to a motor vehicle having a battery arrangement according to the invention or one of the embodiments thereof.

Furthermore, the advantages described in connection with the method according to the invention and the embodiments thereof apply in the same way to the battery arrangement according to the invention and to the motor vehicle according to the invention.

Moreover, the method steps described in connection with the method according to the invention and the embodiments thereof make possible the further development of the battery arrangement according to the invention and of the motor vehicle according to the invention by way of additional corresponding concrete features.

Furthermore, the invention also comprises the combinations of the described embodiments.

BRIEF DESCRIPTION OF THE DRAWINGS

Exemplary embodiments of the invention are described below. Shown for this purpose are.

DETAILED DESCRIPTION

The exemplary embodiments explained below are preferred embodiments of the invention. In the exemplary embodiments, the described components of the embodiments represent individual features of the invention, which are to be regarded as being independent of one another and which the invention further develops in each case also independently of one another and, accordingly, are also to be regarded individually or in a combination different from that shown as belonging to the invention. Furthermore, the described embodiments can be supplemented by features that are additional to the already described features of the invention.

In the figures, functionally identical elements are furnished with the same reference numbers.

Figure 1:
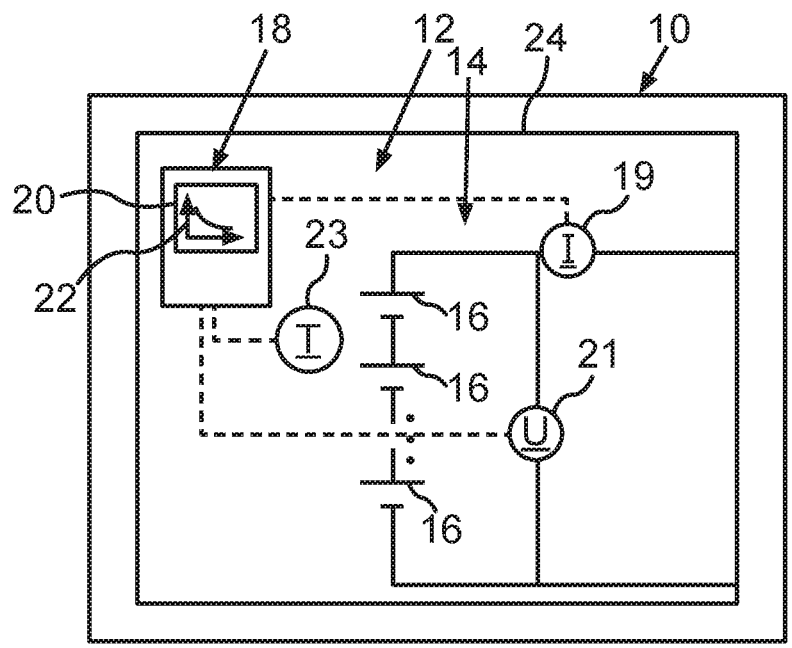
FIG. 1 a schematic illustration of a motor vehicle with a battery arrangement in accordance with an exemplary embodiment of the invention.

FIG. 1 shows a schematic illustration of a motor vehicle 10 with a battery arrangement 12 in accordance with an exemplary embodiment of the invention. In this case, the battery arrangement 12 comprises a battery 14, which has a plurality of battery cells 16, such as, for example, lithium ion cells. In addition, the battery arrangement 12 comprises a control device 18, which has a memory unit 20, in which a field of characteristic curves 22 is stored. Said field of characteristic curves 22 corresponds here to the battery type or the cell chemistry of the battery 14. In other words, the field of characteristic curves 22 was created by means of a test battery, which is of the same battery type as the present battery 14 and, accordingly, has the same cell chemistry. Said field of characteristic curves 22 also describes, for the battery type of the battery 14 for certain predetermined different temperature ranges, the relation between the internal resistance for the specific battery type and the state of charge for the specific battery type. Therefore, in order to determine the current state of charge value of the battery 14, the control device 18 can use a currently recorded temperature T and a currently determined internal resistance value to determine, on the basis of said field of characteristic curves 22, the current state of charge value of the battery 14. For the recording of the current battery temperature T, a corresponding temperature sensor 23 can be used, which is preferably arranged in the vicinity of the battery 14 and, in particular, in the vicinity of the battery cells 16. It is also possible to provide and to use a plurality of temperature sensors 23 for recording the current temperature T of the battery 14. In addition, the current internal resistance value can be determined on the basis of a current and voltage profile for a current load and the voltage response resulting from it. For this purpose, the battery arrangement 12 can further have a current sensor 19 as well as a voltage sensor 21. By means of the current sensor 19, the battery current I that is withdrawn from or supplied to the battery, depending on the situation, can be recorded. Furthermore, by means of the voltage sensor 21, the total voltage U that can be tapped at the battery 14 can be recorded. In this case, the measured quantities T, I, U, recorded by means of said sensors, that is, by means of the current sensor 19, the voltage sensor 21, and the temperature sensor 23, can be conveyed in an ongoing manner to the control device 18, which, on the basis of said quantities and on the basis of the field of characteristic curves 22, determines the corresponding current state of charge value of the battery 14. In this case, the control device 18 can be integrated, in particular, in a battery housing 24, in which the battery 14 is also accommodated. The control device 18 can also be part of a battery management system of the battery arrangement 12.

Figure 2:
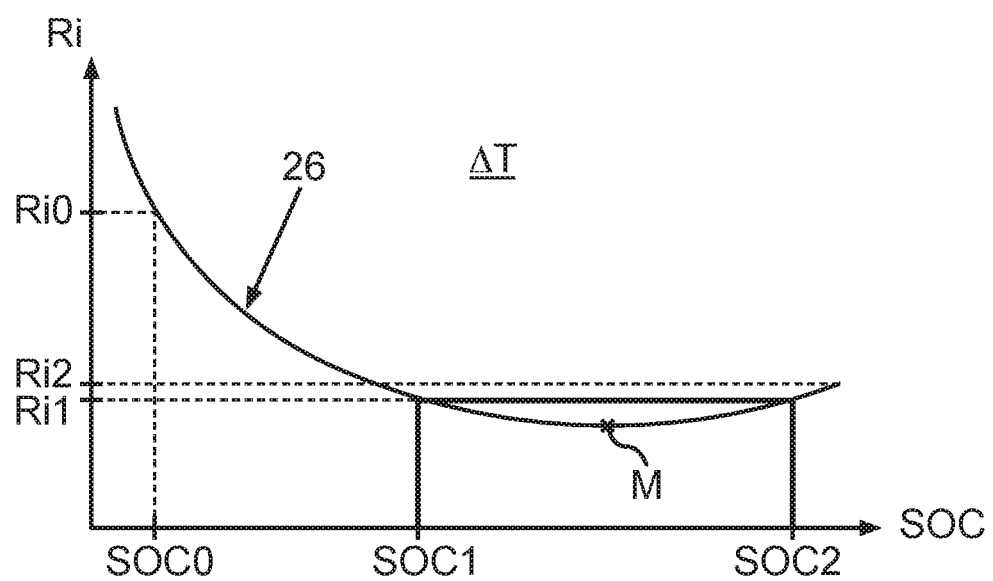
FIG. 2 a schematic illustration of a characteristic curve that describes the relation between the internal resistance and the state of charge for a specific battery type and a specific temperature range, on the basis of which the state of charge of the battery is determined in accordance with an exemplary embodiment of the invention.

FIG. 2 shows a graphic illustration of a characteristic curve 26 for a predetermined temperature range $\Delta T$, which describes the dependence between the internal resistance Ri and the state of charge SOC. If, for example, a current temperature T, which lies in said predetermined temperature range $\Delta T$, is recorded by the control device 18, then the control device 18 can determine, on the basis of the field of characteristic curves 22 and, in particular, on the basis of the present characteristic curve 26 for said predetermined temperature range $\Delta T$, the state of charge SOC of the battery 14 assigned to the currently determined internal resistance Ri in accordance with the field of characteristic curves 26. In this example, illustrated in FIG. 2, however, the dependence between the internal resistance Ri and the state of charge SOC is not clear over the entire range. In this example, therefore, the characteristic curve 26 has a minimum M. If, for example, as illustrated here by way of example, a first internal resistance value Ri0 is determined, for which a clear assignment to the state of charge SOC is possible, then, in accordance with this clear assignment to the determined internal resistance value Ri0, the corresponding state of charge value SOC0 is assigned. If, however, an internal resistance value Ri1 is determined, for which the assignment is not clear, but rather, as illustrated here, is ambiguous, then the determination of the assigned state of charge value is made as follows: If the characteristic curve 26 has only a single minimum M, then, in this situation, at most two potential candidates come into consideration for the state of charge value and are referred to here, by way of example, as SOC1 and SOC2. Furthermore, it is possible advantageously to consider the internal resistance value determined beforehand in a time step, which is referred to here, by way of example, as Ri2. In addition, it is also determined whether the battery 14 is just then in a state in which the battery 14 is being charged or in which the battery 14 is being discharged. This can be determined in a simple way on the basis of the measurement of the current I by way of the current sensor 19. If, therefore, it is established, for example, that the battery 14 is currently being charged, that is, the state of charge SOC increases with time, and the internal resistance Ri2 of the battery 14 determined beforehand in the time step is greater than the currently determined internal resistance value Ri1, then it results from this that the internal resistance Ri falls with increasing state of charge SOC. This means, in turn, that the currently determined internal resistance value Ri1 and also the internal resistance value Ri2 determined beforehand in time must be situated on the left side of the minimum M in relation to the illustration in FIG. 2. Therefore, it results from this that the state of charge value corresponding to the currently measured internal resistance Ri1 also must be situated to the left of the minimum M and, correspondingly, represents the state of charge referred to as SOC1. If, instead of this, a situation in which the battery 14 is just then being discharged is taken into consideration, then precisely the converse case would ensue and the state of charge corresponding to the currently measured internal resistance value Ri1 would lie to the right of the minimum M and, accordingly, would represent the state of charge referred to as SOC2. By considering the time course of the internal resistance Ri, it is therefore advantageously possible, in the case of unclear assignments between the internal resistance Ri and state of charge SOC, to identify the point of the characteristic curve 26 at which one is just then situated. If, in addition, cases in which such a characteristic curve 26 has a plurality of maxima or minima, this being rather unusual in practice, then it is possible, for example, to employ as a plausibility condition, in addition, a state of charge determined via a current integral.

Optionally, in this approach, that is, in the case of the determination of the state of charge SOC based on the field of characteristic curves, it is possible to take into consideration the age of the battery 14 in that, for example, the determined internal resistance Ri is multiplied by a corresponding factor, which depends on the age of the battery 14. In this case, the factor is greater than 1 and is larger, the greater the age of the battery 14 is. This factor, too, can be determined experimentally specially for each battery type, that is, for each cell chemistry.

Overall, by way the invention and the embodiments thereof, it is possible to provide an especially simple and effective method that can be utilized at any time and, above all, also independently of the chemistry, for determining the state of charge or for recalibrating the state of charge.

The invention claimed is:

1. A method for determining a current state of charge value of a battery of a specific battery type, comprising:
   a) provision of a field of characteristic curves, which, for certain different predetermined temperature ranges, specifies an internal resistance for the specific battery type in dependence on a state of charge for the specific battery type;
   b) measurement of a current temperature of the battery;
   c) determination of a current internal resistance value of the battery;
   d) on the basis of the current temperature and the current internal resistance value, determination of the current state of charge value of the battery by the field of characteristic curves,
   wherein the measured current temperature lies in one of the predetermined temperature ranges in which the dependence of the internal resistance on the state of charge has an extreme for an internal resistance value of the field of characteristic curves, and the current state of charge value of the battery is determined by the field of characteristic curves in such a way that it is checked whether at least two states of charge values exist in the field of characteristic curves that, in accordance with the dependence, are assigned to the measured internal resistance value for the predetermined temperature range in which the current temperature lies.

2. The method according to claim 1, further comprising: if the measured current temperature lies in one of the predetermined temperature ranges in which the dependence of the internal resistance on the current state of charge rises or falls strictly monotonically, the current state of charge value of the battery is determined by means of the field of characteristic curves in such a way that the current state of charge value of the battery is set equal to the current state of charge value of the field of characteristic curves that, for the predetermined temperature range in which the currently measured temperature of the battery lies, is assigned to the current determined internal resistance value in accordance with the dependence.

3. The method according to claim 1, wherein the at least two states of charge values are determined from the field of characteristic curves and the current state of charge value of the battery is set equal to one of the at least two states of charge values in accordance with an predetermined selection procedure.

4. The method according to claim 3, wherein in accordance with the predetermined selection procedure, the current state of charge value of the battery is set equal to one of the at least two states of charge values determined from the field of characteristic curves depending on:
   an internal resistance value determined in a preceding time step; and/or
   the kind of extreme, that is, depending on whether the extreme represents a minimum or a maximum; and/or
   a current charging situation of the battery, that is, depending on whether the battery is currently being charged or discharged.

5. The method according to claim 4, wherein the current charging situation is determined by a measurement of a battery current of the battery.

6. The method according to claim 3, wherein in accordance with the predetermined selection procedure, a second state of charge value of the battery is determined by means of an integration of a battery current of the battery over time and is compared with the at least two states of charge values determined from the field of characteristic curves, and the value of that one of the at least two states of charge values from the field of characteristic curves is set equal to the current state of charge value of the battery that has a smaller difference relative to the second state of charge value.

7. The method according to claim 1, wherein the current internal resistance value is determined as a quotient from a voltage change of a battery voltage that results from a change of a battery current of the battery, and the change of the battery current is determined.

8. The method according to claim 1, wherein the current internal resistance value is determined in ongoing repetition based on an ongoing recording of current fluctuations of a measured battery current of the battery and on voltage changes of the battery voltage associated with said current fluctuations.

9. A battery arrangement comprising:
   a battery of a specific battery type and a control device for determining a current state of charge value of the battery, wherein the control device has a memory unit, in which a field of characteristic curves is stored, which, for certain different predetermined temperature ranges, specifies an internal resistance for the specific battery type depending on a state of charge for the specific battery type, wherein the battery arrangement has a sensor device, which is designed to record a current temperature of the battery and to determine a current internal resistance value of the battery, wherein the control device is designed to determine, on the basis of the current temperature and the current internal resistance value, the current state of charge value of the battery by the field of characteristic curves,
   wherein the measured current temperature lies in one of the predetermined temperature ranges in which the dependence of the internal resistance on the state of charge has an extreme for an internal resistance value of the field of characteristic curves, and the current state of charge value of the battery is determined by the field of characteristic curves in such a way that it is checked whether at least two states of charge values exist in the field of characteristic curves that, in accordance with the dependence, are assigned to the measured internal resistance value for the predetermined temperature range in which the current temperature lies.

* * * * *